US009352562B2

(12) United States Patent
Takahashi et al.

(10) Patent No.: US 9,352,562 B2
(45) Date of Patent: May 31, 2016

(54) ELECTRIC CONNECTION METHOD

(71) Applicant: CANON KABUSHIKI KAISHA, Tokyo (JP)

(72) Inventors: Tomohiro Takahashi, Yokohama (JP); Takayuki Ono, Kawasaki (JP); Masao Furukawa, Yokohama (JP); Jun Hinami, Kawasaki (JP); Takeshi Shibata, Yokohama (JP); Ryo Shimamura, Yokohama (JP); Takanori Enomoto, Tokyo (JP); Shimpei Otaka, Kawasaki (JP); Masashi Ishikawa, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 14/174,732

(22) Filed: Feb. 6, 2014

(65) Prior Publication Data
US 2014/0225957 A1  Aug. 14, 2014

(30) Foreign Application Priority Data

Feb. 8, 2013  (JP) .................................. 2013-023351

(51) Int. Cl.
*B41J 2/14* (2006.01)
*B41J 2/01* (2006.01)
*H01L 23/00* (2006.01)
*H05K 3/32* (2006.01)

(52) U.S. Cl.
CPC ................ *B41J 2/14072* (2013.01); *B41J 2/01* (2013.01); *H01L 24/06* (2013.01); *H01L 24/49* (2013.01); *H01L 24/85* (2013.01); *H01L 24/45* (2013.01); *H01L 2224/05553* (2013.01); *H01L 2224/0603* (2013.01); *H01L 2224/451* (2013.01); *H01L 2224/45015* (2013.01); *H01L 2224/45144* (2013.01); *H01L 2224/45147* (2013.01); *H01L 2224/48091* (2013.01); *H01L 2224/48227* (2013.01); *H01L 2224/49175* (2013.01); *H01L 2224/73265* (2013.01); *H01L 2224/85* (2013.01); *H01L 2224/85205* (2013.01); *H01L 2224/85234* (2013.01); *H01L 2224/92247* (2013.01); *H05K 3/328* (2013.01); *H05K 2203/049* (2013.01); *H05K 2203/1105* (2013.01); *Y10T 29/49162* (2015.01)

(58) Field of Classification Search
CPC ..................................................... B41J 2/14072
See application file for complete search history.

(56) References Cited

U.S. PATENT DOCUMENTS 5,859,407 A * 1/1999 Saiki et al. .................... 219/209
2002/0001020 A1 * 1/2002 Mrvos et al. .................... 347/65

FOREIGN PATENT DOCUMENTS

JP           590355 A      4/1993
JP           722458 A      1/1995

* cited by examiner

*Primary Examiner* — Alessandro Amari
*Assistant Examiner* — Jeffrey C Morgan
(74) *Attorney, Agent, or Firm* — Canon U.S.A., Inc. IP Division

(57) ABSTRACT

An electric connection method for connection between a semiconductor substrate and an electric wiring substrate includes a first process for providing the semiconductor substrate having a heating member and a pad and the electric wiring substrate having first wiring and second wiring, a second process for electrically connecting the first wiring and the heating member, a third process for causing the heating member to generate heat by supplying power to the heating member through the first wiring, and a fourth process for electrically connecting the pad and the second wiring at a temperature higher than a temperature for electrically connecting the first wiring and the heating member.

8 Claims, 10 Drawing Sheets

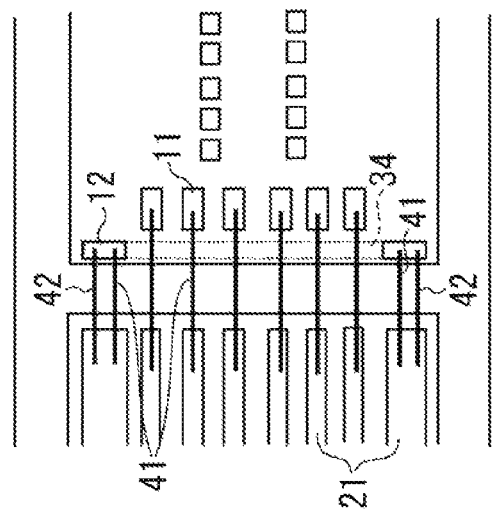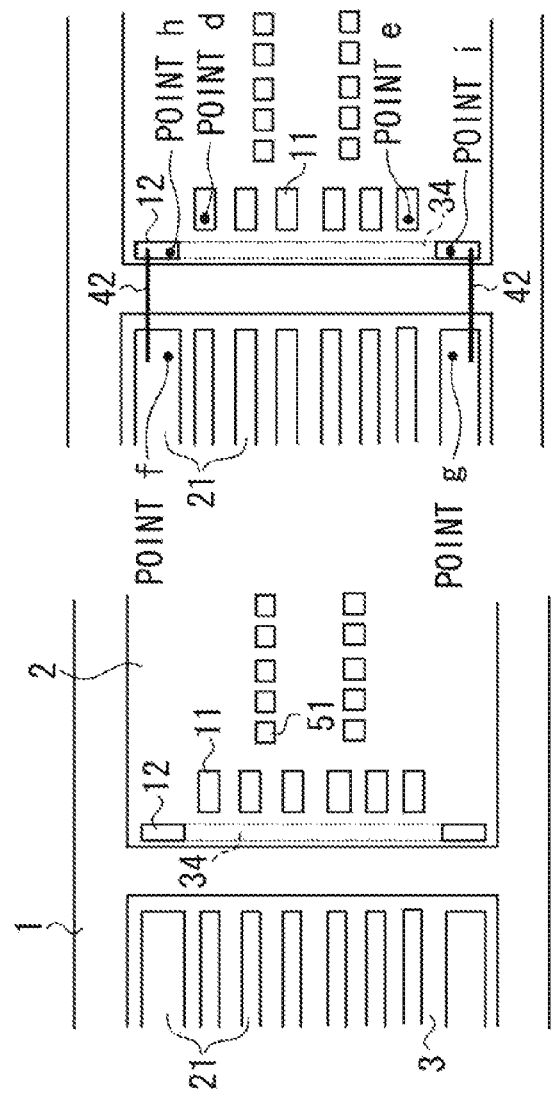

ELECTRIC CONNECTION METHOD

BACKGROUND OF THE INVENTION

1. Field of the Invention

The present invention relates to an electric connection method for connection between a semiconductor substrate and an electric wiring substrate.

2. Description of the Related Art

Wire bonding and inner lead bonding (ILB) are examples of electric connection methods for a semiconductor substrate and an electric wiring substrate.

For example, the wire bonding is a method for electrically connecting a pad disposed on the semiconductor substrate and a wiring portion disposed on the electric wiring substrate with a metal wire. In general, gold or aluminum is used as a material for the pad, and gold or copper is used as a material for the wiring portion and the wire. The pad and the wire can be connected to each other by pressing and attaching the electric connection portion by heating the electric connection portion to a temperature above the melting points of the metallic materials. However, when damage caused by the heat to the semiconductor substrate is taken into consideration, it is desirable not to heat the electric connection portion to the temperature above the melting points of the metallic materials. An ultrasonic wave is generally used in combination with heat in order to connect the pad and the wire at low temperature. A method for forming an electric connection by using the ultrasonic wave in combination with heat is also used in the ILB.

On the other hand, various kinds of stress may be applied to the electric connection portion when a finished product is actually in use. The stress arising from expansion and contraction of the wire due to change in an environmental temperature may be given as an example. A stronger connection state has to be realized because the electric connection state should be maintained even if the stress is applied to the electric connection portion. Generally, in order to realize the electric connection portion maintaining a state capable of withstanding the stress that is applied to the electric connection portion when the product is actually in use, the electric connection portion is heated to a temperature equal to or higher than 150° C. even if the connection method using the ultrasonic wave in combination with heat is employed.

In a configuration in which a semiconductor substrate and an electric wiring substrate are disposed on a supporting substrate, a method in which an electric connection portion is heated via the supporting substrate by making a heater block contact with a back surface of the supporting substrate is generally employed as a method for heating the electric connection portion in the electric connection process. With this method, in a case where a material having low thermal conductivity is used for the supporting substrate, a long period of time is required to heat the electric connection portion to a desired temperature. Further, in a case where a material having low thermal resistance is used for the supporting substrate, the heating temperature depends on the thermal resistance of the supporting substrate, and thus the electric connection portion cannot be heated to a temperature necessary to realize the electric connection portion maintaining the firm connection state. These issues are present in the connection method in which the electric connection portion on the front surface of the supporting substrate is heated from the back surface thereof.

With respect to the above issues, Japanese Patent Application Laid-Open No. 7-22458 discusses a method for electrically connecting the electric connection portion by heating the electric connection portion with hot air blowing on the surface of the semiconductor substrate. Further, Japanese Patent Application Laid-Open No. 5-90355 discusses a method for electrically connecting the electric connection portion by causing the electric connection portion itself to generate heat by applying high-frequency electric current to the electric connection portion through two electrodes that make contact with the electric connection portion of the semiconductor substrate.

In the electric connection process, in order to adjust a position for making an electric connection with high precision, in general, a predetermined shape pattern on the semiconductor substrate and the electric wiring substrate is read by an image recording apparatus to perform a positional adjustment through image processing. When the surface of a semiconductor substrate is blown by the hot air of 150° C. as in the method discussed in Japanese Patent Application Laid-Open No. 7-22458, there arises a problem in stably performing a positional adjustment with high precision. In the above method, because of hot air passing through a space between the image recording apparatus and a point to be recorded, fluctuation occurs in the image to be recognized by the image recording apparatus.

Further, with the method disclosed in Japanese Patent Application Laid-Open No. 5-90355, in which the high-frequency electric current is applied to the electric connection portion of the semiconductor substrate, the problem in performing the positional adjustment is reduced because hot air does not pass through the space between the image recording apparatus and the point to be recorded. However, respective processes, such as making the electrodes contact with the electric connection portion, applying the high-frequency electric current to the electric connection portion, and separating the electrodes from the electric connection portion, have to be performed on the electric connection portion one by one. Thus, a long period of process time will be required in order to make a number of electric connections for a single semiconductor substrate.

SUMMARY OF THE INVENTION

The present invention is directed to an electric connection method for electrically connecting a semiconductor substrate and an electric wiring substrate within a short period of process time by heating the electric connection portion without interposing a supporting substrate, while reducing the negative effect on a positional adjustment using an image recording apparatus.

According to an aspect of the present invention, an electric connection method for connection between a semiconductor substrate and an electric wiring substrate, the electric connection method includes a first process for providing the semiconductor substrate including a heating member and a pad and the electric wiring substrate including first wiring and second wiring, a second process for electrically connecting the first wiring and the heating member, a third process for causing the heating member to generate heat by supplying power to the heating member through the first wiring, and a fourth process for electrically connecting the pad and the second wiring at a temperature higher than a temperature for electrically connecting the first wiring and the heating member.

According to another aspect of the present invention, an electric connection method for connection between a recording element substrate for discharging a liquid and an electric wiring substrate, the electric connection method includes a first process for providing the recording element substrate including a discharge energy generation element for generating energy used to discharge a liquid, a heating member, and a pad, and the electric wiring substrate including wiring, and a second process for electrically connecting the pad and the wiring by causing the heating member to generate heat.

Further features of the present invention will become apparent from the following description of exemplary embodiments with reference to the attached drawings.

BRIEF DESCRIPTION OF THE DRAWINGS

FIGS. 12A, 12B, and 12C are schematic diagrams illustrating a process of an electric connection method according to a third exemplary embodiment.

DESCRIPTION OF THE EMBODIMENTS

Various exemplary embodiments, features, and aspects of the invention will be described in detail below with reference to the drawings.

Figure 1A:
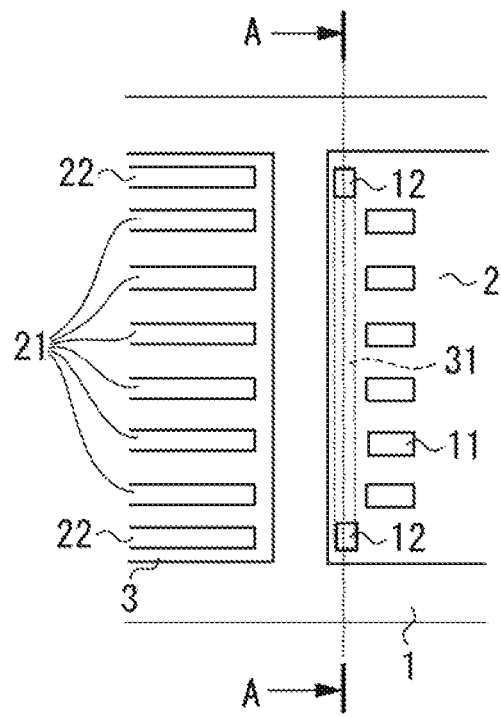
FIGS. 1A and 1B are schematic diagrams illustrating a configuration before performing an electric connection according to a first exemplary embodiment.
Figure 1B:
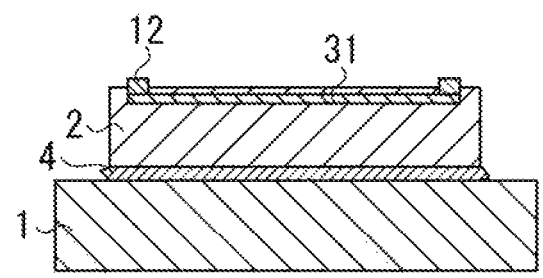

An electric connection method according to the first exemplary embodiment will be described by taking the wire bonding as an example. FIGS. 1A and 1B are schematic diagrams illustrating a configuration before performing an electric connection according to the exemplary embodiment of the present invention. FIG. 1A is a top plan view, and FIG. 1B is a cross-sectional view taken along a line A-A.

A semiconductor substrate 2 and an electric wiring substrate 3 are disposed on a supporting substrate 1 and adhered thereto with an adhesive 4. Pads 11 and wiring that are electrically connected to each other are respectively disposed on the semiconductor substrate 2 and the electric wiring substrate 3. Power can be supplied through the wiring 21 (second wiring). A first heater serving as a heating member, which does not have a function when the product is in use, is disposed on the semiconductor substrate 2 in the arrangement direction of the pads 11. The first heater is only used to heat the pads 11 and the wiring 21 when the pads 11 and the wiring are electrically connected to each other, and corresponds to a first dummy heater 31, which does not have a function when the product is in use. Heater connection pads 12 for performing an electric connection are disposed on both ends of the first dummy heater 31. First electric wiring 22 (second wiring) capable of supplying power to the first dummy heater 31 is disposed on the electric wiring substrate 3. The first dummy heater 31, the heater connection pads 12, and the first electric wiring 22 are only used to heat the pads 11 and the wiring 21 when the pads 11 and the wiring 21 are electrically connected to each other, and do not have functions when the product is in use.

A mixture of polyphenylene sulfide (PPS) of 20% and spherical silica of 80% is used as a material for the supporting substrate 1. Because the thermal conductivity of this material is low at 0.8 W/(m·K), a long period of time is required in order to heat the electric connection portion via the supporting substrate 1. Therefore, heating the electric connection portion via the supporting substrate 1 is not suitable as the heating method.

Any substance that generates heat by conducting power may be used as a material for the first dummy heater 31. In the present exemplary embodiment, tantalum silicon nitride (TaSiN) is used. Any metal substance that can be bonded to a below-described wire for the wire bonding may be used as the materials of the pads 11, the heater connection pads 12, the wiring 21, and the first electric wiring 22. In the present exemplary embodiment, gold (Au) is used as the materials.

Next, processes of the electric connection method will be described in detail.

<First Process>

Figure 2A:
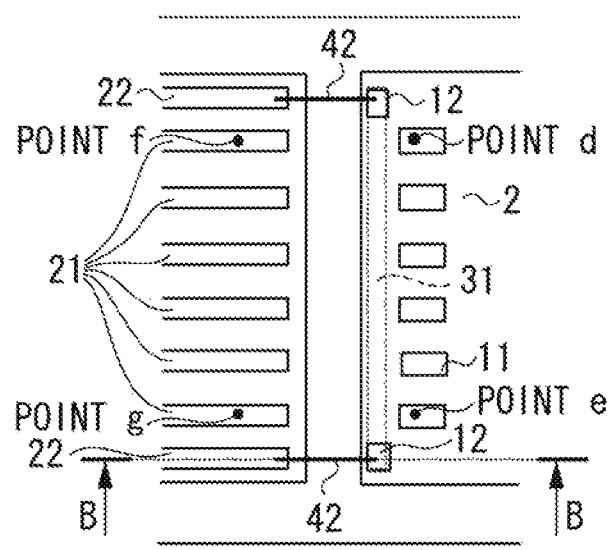
FIGS. 2A and 2B are schematic diagrams illustrating a process of an electric connection method according to the first exemplary embodiment.
Figure 2B:
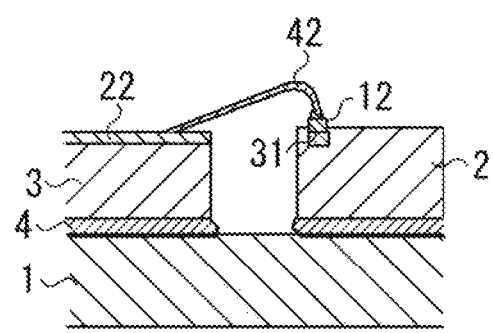

The first process will be described with reference to FIGS. 2A and 2B. First, the semiconductor substrate 2 and the electric wiring substrate 3 are prepared. FIG. 2A is a top plan view, and FIG. 2B is a cross-sectional view taken along a line B-B. The heater connection pads 12 and the first electric wiring 22 are electrically connected to each other through the wire bonding while using the ultrasonic wave to form an electric circuit. Each of the heater connection pads 12 and the first electric wiring 22 are electrically connected through a second wire 42. At this time, the electric connection portion does not have to be heated. As described above, if the electric connection portion is electrically connected without being heated, the connection state thereof is not as strong as the connection state achieved in the electric connection process accompanied by heating process. However, the heater connection pads 12 and the first electric wiring 22 are only used to heat the pads 11 and the wiring 21 when the pads 11 and the wiring 21 are electrically connected to each other, and do not have functions for the product. Therefore, a strong connection state is not necessarily required as long as the electric connection portion can obtain the connection state sufficient for supplying power to the first dummy heater 31. In such a case, the electric connection portion does not have to be heated in particular. In general, Au or copper (Cu) is used as a material for the wire. In the present exemplary embodiment, a wire made of Au having a wire diameter of 25 μm is used. As the conditions for performing an electric connection, a frequency of the ultrasonic wave is set to 100 kHz, and loads applied to the heater connection pads 12 and the first electric wiring 22 in the connection process are respectively set to 50 g and 150 g.

<Second Process>

Power is supplied from the first electric wiring 22 to the first dummy heater 31 via the second wires 42 and the heater connection pads 12. The first dummy heater 31 generates heat, so that the pads 11 are heated by the heat transmitted from the first dummy heater 31. In addition, the wiring 21 is heated by the radiant heat emitted from the first dummy heater 31.

The temperatures at respective points illustrated in FIG. 2A, which are measured at 10 seconds after starting the power supply, are 190° C. and 180° C. at the points d and e of the pads 11, and 170° C. and 160° C. at the points f and g of the wiring 21. Both the pads 11 and the wiring 21 have reached to the temperatures equal to or higher than 150° C. that are necessary for the electric connection portions to obtain the connection states capable of withstanding the external force that is assumed to be applied to the electric connection portions when the product is in use.

In addition, the temperatures of the pads 11 and the wiring 21 can be adjusted by adjusting the amount of power supplied to the first dummy heater 31.

<Third Process>

Figure 3A:
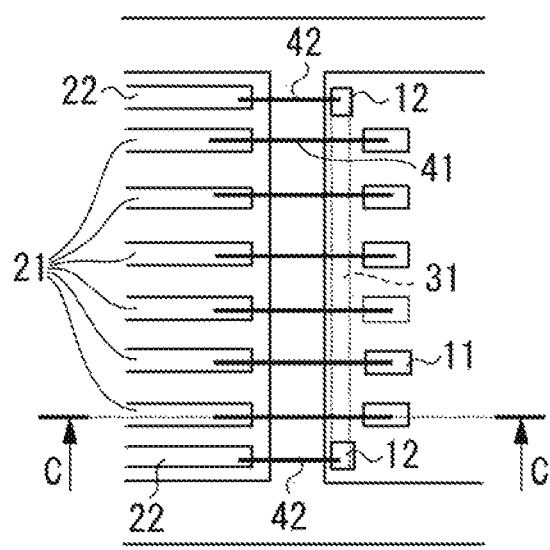
FIGS. 3A and 3B are schematic diagrams illustrating a process of the electric connection method according to the first exemplary embodiment.
Figure 3B:
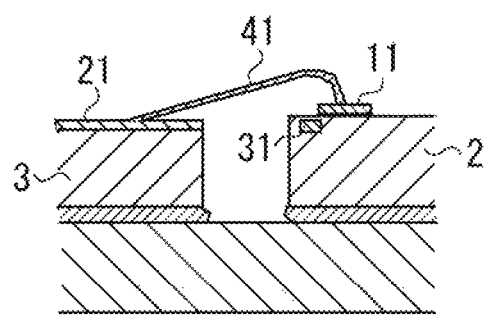

The third process will be described with reference to FIGS. 3A and 3B. FIG. 3A is a top plan view, and FIG. 3B is a cross-sectional view taken along a line C-C. The pads 11 and the wiring 21 are electrically connected to each other through the wire bonding while using the ultrasonic wave. As the conditions for performing an electric connection, a frequency of the ultrasonic wave is set to 100 kHz, and loads applied to the pads 11 and the wiring 21 in the connection process are respectively set to 50 g and 150 g. Each of the pads 11 and the wiring 21 are electrically connected to each other through a first wire 41.

Because the pads 11 and the wiring 21 are heated in the second process, in this process, the pads 11 and the wiring 21 are electrically connected to each other at a temperature higher than the temperature in the first process. Further, because the pads 11 and the wiring 21 are heated to the temperatures equal to or higher than 150° C., electric connection portions between the pad 11 and the first wire 41, and electric connection portions between the wiring 21 and the first wires 41 can obtain the connection states capable of withstanding the external force that is assumed to be applied to the electric connection portions when the product is in use.

According to the present exemplary embodiment, because a plurality of the pads 11 and the wiring 21 can be heated at once by supplying power to a single first dummy heater 31, electric connection process can be performed within a short period of process time. Furthermore, because the electric connection portion is not blown by hot air, the negative effect on the positional adjustment using the image recording apparatus can be reduced.

Figure 4:
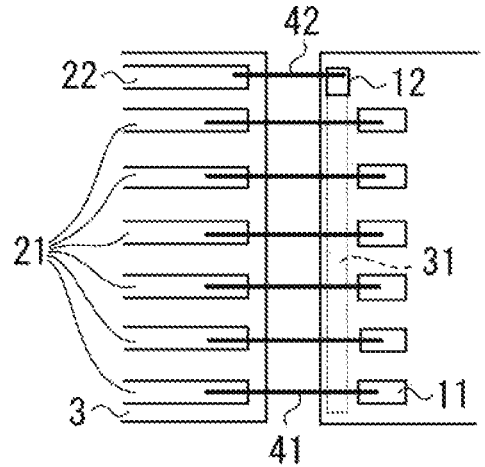
FIG. 4 is a schematic diagram illustrating an arrangement example of a first dummy heater.

In addition, according to the present exemplary embodiment, the electric circuit has been formed in such a manner that the heater connection pads 12 are respectively disposed on both ends of the first dummy heater 31, so as to be electrically connected to the first electric wiring 22 individually. However, the configuration is not limited thereto, and other configurations may be employed as long as power can be supplied to the first dummy heater 31. In other words, as illustrated in FIG. 4, the configuration may be such that the heater connection pad 12 is disposed on only one end of the first dummy heater 31, while another end of the first dummy heater 31 is earthed. With this configuration, the first electric wiring 22 is not necessary for the another end of the first dummy heater 31 that is earthed. Because the unnecessary first electric wiring 22 is eliminated, a space required therefor can be eliminated from the electric wiring substrate 3, and thus a size of the electric wiring substrate 3 can be reduced.

Figure 5:
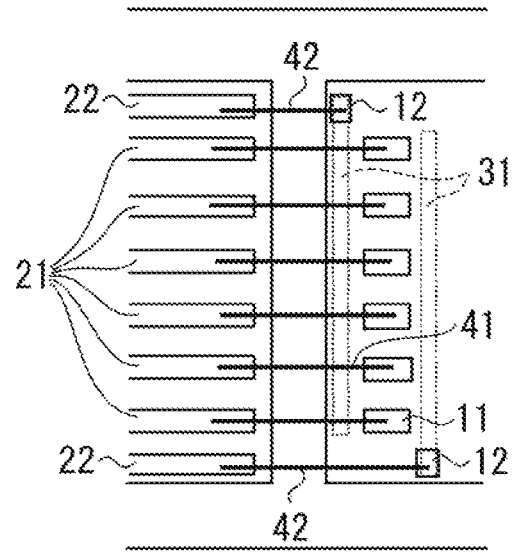
FIG. 5 is a schematic diagram illustrating an arrangement example of the first dummy heater.
Figure 6A:
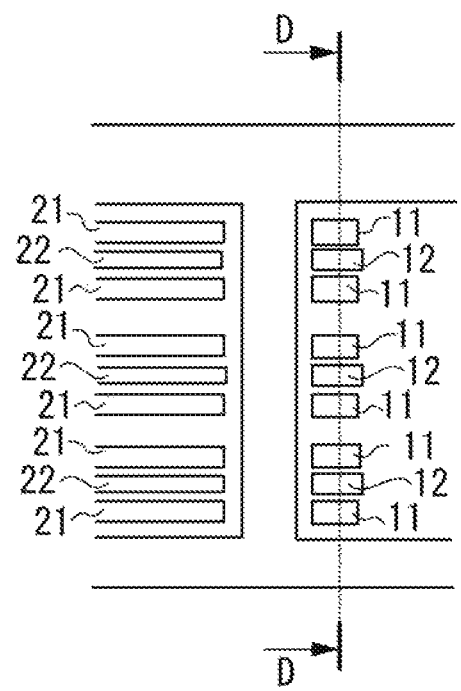
FIGS. 6A and 6B are schematic diagrams illustrating an arrangement example of the first dummy heater.
Figure 6B:
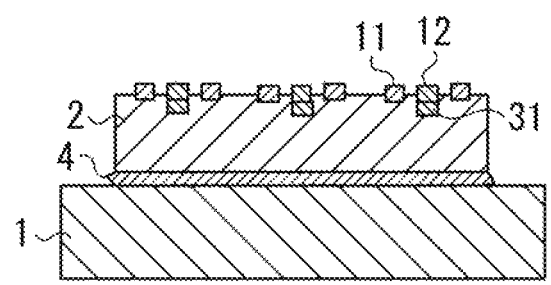

Further, according to the present exemplary embodiment, the first dummy heater 31 is singly disposed in the arrangement direction of the pads 11. However, a method for disposing the first dummy heater 31 is not limited thereto. For example, as illustrated in FIG. 5, the first dummy heaters 31 may be disposed on two places with the array of pads 11 in between. Furthermore, as illustrated in FIGS. 6A and 6B, the first dummy heaters 31 may be respectively disposed on the spaces between the pads 11. FIGS. 6A and 6B are schematic diagrams illustrating an arrangement example of the first dummy heaters 31. FIG. 6A is a top plan view, and FIG. 6B is a cross-sectional view taken along a line D-D. As illustrated in FIGS. 6A and 6B, because a greater number of the first dummy heaters 31 is disposed with respect to the number of the pads 11, the pads 11 are less likely to be affected by the effect of temperature distribution within the first dummy heaters 31, and thus differences in temperatures at each of the pads 11 and the wiring 21 become smaller. With this configuration, the stable connection strength can be obtained at each of the electric connection portions. Because the power can be simultaneously supplied to each of the first dummy heaters 31 even if the first dummy heaters 31 are increased in number, a period of process time will be not so long.

The above arrangement configurations can be appropriately selected in accordance with the convenience of the layout for the semiconductor substrate 2 or the electric wiring substrate 3, and with a desired heating temperature for the electric connection portion.

According to the present exemplary embodiment, because the electric connection portion can be heated without interposing the supporting substrate 1, the electric connection portion can be heated within a short period of process time even if the supporting substrate 1 is a material having low thermal conductivity. The same can be said for the case where a member of which material has low thermal conductivity is disposed between the semiconductor substrate 2 or the electric wiring substrate 3 and the supporting substrate 1.

Further, even if the supporting substrate 1 is a material having high thermal conductivity, the present exemplary embodiment has a beneficial effect if a long period of process time is required when the electric connection portion is heated from the back surface of the supporting substrate 1. For example, in a case where the supporting substrate 1 is thick, or a contact area between the heater block and the supporting substrate 1 cannot be large enough due to a concave-convex surface of the back side of the supporting substrate 1, a long period of process time will be required if the electric connection portion is heated from the back surface of the supporting substrate 1. Even in the above-described cases, the electric connection portion can be heated within a shorter period of process time because the electric connection portion can be heated without interposing the supporting substrate 1 according to the present exemplary embodiment.

In the present exemplary embodiment, the wire bonding has been described as an example of the electric connection method. However, the electric connection method to which the present invention is applicable is not limited thereto, and the present invention is also applicable to the ILB in which the connection portion has to be heated when the electric connection is performed thereon.

Further, according to the present exemplary embodiment, the dummy heater, which does not have a function for the product, is disposed on the semiconductor substrate. However, a heater that has a function for the product such as a liquid discharge head may be disposed separately. In such a case, the electric connection method according to the present exemplary embodiment is applicable to the production of the liquid discharge head.

Figure 7A:
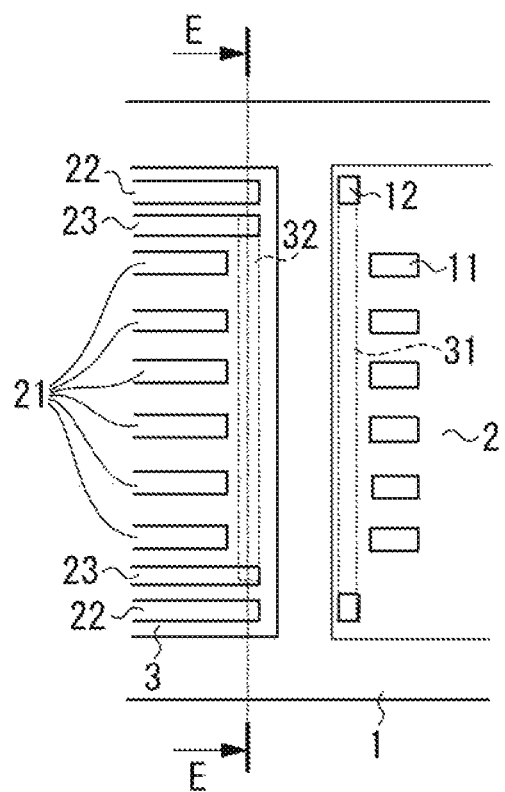
FIGS. 7A and 7B are schematic diagrams illustrating a configuration before performing an electric connection according to a second exemplary embodiment.
Figure 7B:
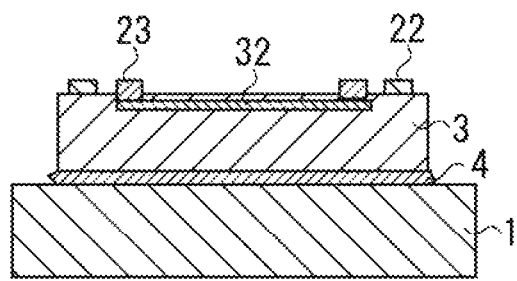

An electric connection method according to the second exemplary embodiment will be described by taking the wire bonding as an example. FIGS. 7A and 7B are schematic diagrams illustrating a configuration before performing an electric connection according to the exemplary embodiment of the present invention. FIG. 7A is a top plan view, and FIG. 7B is a cross-sectional view taken along a line E-E.

A configuration of the semiconductor substrate 2 is the same as that described in the first exemplary embodiment. The first electric wiring 22 for supplying power to the first dummy heater 31 is disposed on the electric wiring substrate 3. Further, a second heater serving as a heating member is disposed on the electric wiring substrate 3. The second heater corresponds to a second dummy heater 32, which does not have a function when the product is in use. Second electric wiring 23 capable of supplying power is connected to the second dummy heater 32.

Next, processes of the electric connection method will be described in detail.

<First Process>

Figure 8:
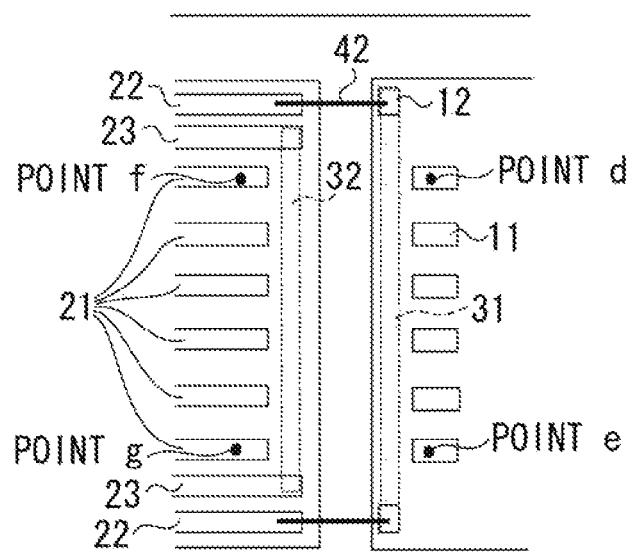
FIG. 8 is a schematic diagram illustrating a process of an electric connection method according to the second exemplary embodiment.

In the same manner as the first exemplary embodiment, the heater connection pads 12 and the first electric wiring 22 are electrically connected to each other through the wire bonding while using the ultrasonic wave to form an electric circuit (see FIG. 8). The conditions for performing an electric connection and the material for the wire are the same as those described in the first process of the first exemplary embodiment. Because the heater connection pads 12 and the first electric wiring 22 do not have functions for the product, the electric connection portions do not have to be heated in the electric connection process.

Each of the heater connection pads 12 and the first electric wiring 22 are electrically connected to each other through the second wire 42.

<Second Process>

Power is supplied from the first electric wiring 22 to the first dummy heater 31 via the second wires 42 and the heater connection pads 12. Power is supplied from the second electric wiring 23 to the second dummy heater 32. Both the first dummy heater 31 and the second dummy heater 32 generate heat, and the pads 11 are heated with the heat mainly transmitted from the first dummy heater 31, and the wiring 21 is heated with the heat mainly transmitted from the second dummy heater 32. The temperatures at respective points illustrated in FIG. 8, which are measured at 10 seconds after starting the power supply, are 190° C. and 180° C. at the points d and e of the pads 11, and 185° C. and 175° C. at the points f and g of the wiring 21. Both the pads 11 and the wiring 21 have reached to the temperatures equal to or higher than 150° C. that are necessary for the electric connection portions to obtain the connection states capable of withstanding the external force assumed to be applied to the electric connection portions when the product is in use. Further, according to the present exemplary embodiment, the heater is also disposed on the electric wiring substrate 3 to generate heat in addition to the semiconductor substrate 2, so that difference in temperatures between the pads 11 and the wiring 21 becomes smaller when compared to that in the first exemplary embodiment.

In addition, the temperatures of the pads 11 and the wiring 21 can be adjusted by adjusting the amount of power supplied to the first dummy heater 31 and the second dummy heater 32.

<Third Process>

Figure 9:
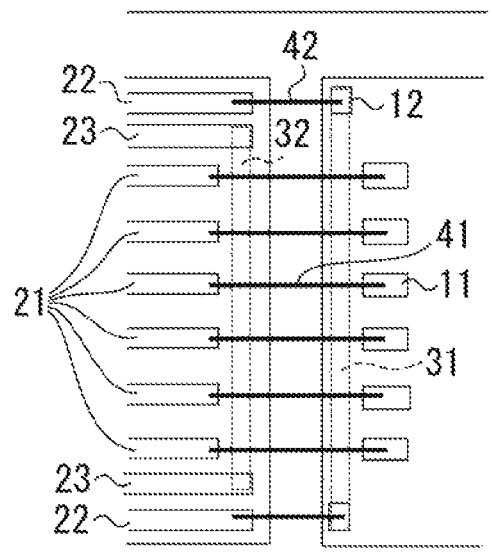
FIG. 9 is a schematic diagram illustrating a process of the electric connection method according to the second exemplary embodiment.

In the same manner as the first exemplary embodiment, the pads 11 and the wiring 21 are electrically connected to each other through the wire bonding while using the ultrasonic wave (see FIG. 9). The conditions for making an electric connection and the material for the wire are the same as those described in the third process of the first exemplary embodiment. Each of the pads 11 and the wiring 21 are electrically connected to each other through the first wire 41.

Because the pads 11 and the wiring 21 are heated in the second process, in this process, the pads 11 and the wiring 21 are electrically connected to each other at a temperature higher than the temperature in the first process. Further, because the pads 11 and the wiring 21 are heated to the temperatures equal to or higher than 150° C., electric connection portions between the pad 11 and the first wire 41, and electric connection portions between the wiring 21 and the first wire 41 can obtain the connection states capable of withstanding the external force that is assumed to be applied to the electric connection portions when the product is in use.

Furthermore, in the same manner as the first exemplary embodiment, a method for disposing the first dummy heater 31 is not limited to the above-described configuration. The configuration may be such that the heater connection pad 12 is disposed on only one end of the first dummy heater 31 while another end of the first dummy heater 31 is earthed. In addition, a configuration in which the dummy heaters 31 are disposed on two places with the array of pads 11 in between, or a configuration in which the first dummy heaters 31 are respectively disposed between the pads 11 may be employed as well.

Figure 10:
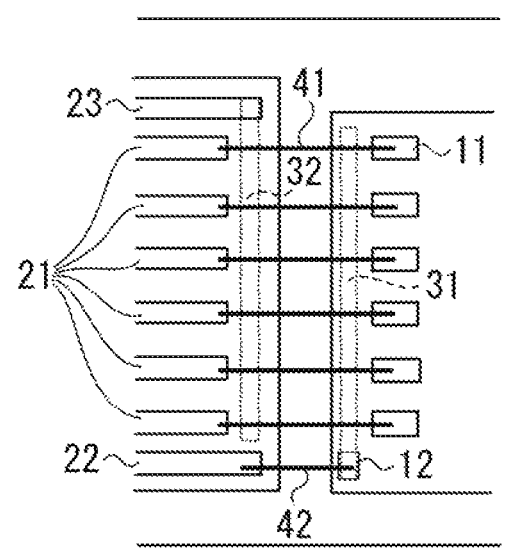
FIG. 10 is a schematic diagram illustrating another arrangement example of a second dummy heater.

In a similar manner, a method for disposing the second dummy heater 32 is not limited to the above-described configuration. A configuration in which one end of the second dummy heater 32 is earthed (see FIG. 10), or a configuration in which the second dummy heaters 32 are respectively disposed on the spaces between wires of the wiring 21 may be employed as well. The above-described arrangement configurations can be appropriately selected in accordance with the convenience of the layout for the semiconductor substrate 2 or the electric wiring substrate 3, and with a desired heating temperature for the electric connection portion.

According to the present exemplary embodiment, because the electric connection portion can be heated to a desired temperature without interposing the supporting substrate 1, the exemplary embodiment is also applicable to the case where the supporting substrate 1 is a material having low thermal conductivity or low thermal resistance. Furthermore, the exemplary embodiment is also applicable to the case where the member having low thermal conductivity or low thermal resistance is disposed between the semiconductor substrate 2 or the electric wiring substrate 3 and the supporting substrate 1.

In the present exemplary embodiment, the wire bonding has been described as an example of the electric connection method. However, the electric connection method to which the present invention is applicable is not limited thereto, and the present invention is also applicable to the ILB in which the electric connection portion has to be heated when the electric connection is performed thereon.

Further, according to the present exemplary embodiment, the dummy heater, which does not have a function for the product, is disposed on the semiconductor substrate. However, a heater that has a function for the product such as a liquid discharge head may be disposed separately. In such a case, the electric connection method according to the present exemplary embodiment is applicable to the production of the liquid discharge head.

In the third exemplary embodiment, an application example of the electric connection method according to the present invention, which is applied to the production of a liquid discharge head that discharges a liquid such as ink, will be described.

Figure 11:
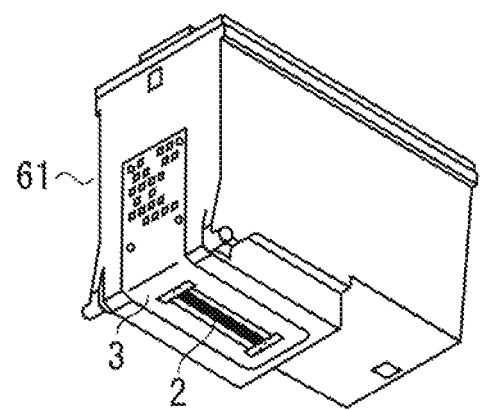
FIG. 11 is a schematic diagram illustrating a configuration of a liquid discharge head.

FIG. 11 is a diagram illustrating a liquid discharge head produced by the electric connection method according to the present exemplary embodiment. FIGS. 12A, 12B, and 12C are schematic diagrams illustrating the application example of the electric connection method according to the present invention, which is applied to the production of the liquid discharge head.

The semiconductor substrate 2 serving as a recording element substrate for discharging a liquid such as ink and the electric wiring substrate 3 are disposed on the supporting substrate 1 and adhered to the supporting substrate 1 with an adhesive. In the same manner as in the first exemplary embodiment, a mixture of polyphenylene sulfide (PPS) of 20% and spherical silica of 80% is used as a material for the supporting substrate 1.

The pads 11 and the wiring 21 which are electrically connected to each other are respectively disposed on the semiconductor substrate 2 and the electric wiring substrate 3. Further, discharge energy generation elements 51 and a heater 34 are disposed on the semiconductor substrate 2. The discharge energy generation elements 51 generate energy for discharging a recording liquid, and the heater 34 is used to heat the semiconductor substrate 2 when the product is in use. The heater connection pads 12 for performing an electric connection are disposed on both ends of the heater 34.

TaSiN is used as the material for the heater 34. Au is used for the materials for the pads 11, the heater connection pads 12, and the wiring 21.

Next, the processes of the electric connection method through the wire bonding will be described in detail with reference to FIGS. 12A, 12B, and 12C. FIG. 12A is a schematic diagram illustrating a configuration before making an electric connection.

<First Process>

The first process is for temporarily connecting the heater connection pads 12 and the wiring 21. The heater connecting pads 12 and the wiring 21 are electrically connected to each other through the wire bonding while using the ultrasonic wave to form an electric circuit. The load applied to the wiring 21 in the connection process is set to 150 g, while the other conditions for performing an electric connection and the material for the wire are the same as those described in the first process of the first exemplary embodiment. Each of the heater connection pads 12 and the wiring 21 are temporarily connected through the second wire 42 (see FIG. 12B).

The electric connection portion formed in this process is only used to heat the heater 34 in the second process. Therefore, the electric connection portion does not necessarily require a strong connection state as long as the electric connection portion can obtain the connection state sufficient for supplying power to the heater 34 in the second process. Thus, in this process, the heating process is not required while performing an electric connection. The conditions for making an electric connection and the material for the wire are the same as those described in the first process of the first exemplary embodiment.

<Second Process>

Power is supplied to the heater 34 from the wiring 21 via the second wires 42 and the heater connection pads 12. The heater 34 generates heat to heat the pads 11 and the heater connection pads 12 by the heat transmitted from the heater 34. In addition, the wiring 21 is heated by the heat emitted from the heater 34.

The temperatures at respective points illustrated in FIG. 12B, which are measured at 10 seconds after starting the power supply, are 180° C. and 170° C. at the points d and e of the pads 11, 190° C. and 180° C. at the points h and i of the heater connection pads 12, and 170° C. and 160° C. at the points f and g of the wiring 21. The pads 11, the heater connection pads 12, and the wiring 21 have reached to the temperatures equal to or higher than 150° C. that are necessary for the electric connection portions to obtain the connection states capable of withstanding the external force that is assumed to be applied thereto when the product is in use.

In addition, the temperatures of the pads 11, the heater connection pads 12, and the wiring 21 can be adjusted by adjusting the amount of power supplied to the heater 34.

<Third Process>

The heater connection pads 12 and the wiring 21 are electrically connected to each other through the wire bonding while using the ultrasonic wave. The conditions for performing an electric connection and the material for the wire are the same as those described in the first process. Each of the heater connection pads 12 and the wiring 21 are electrically connected through the first wire 41. The electric connection portions of the second wire 42 have low connection strength in the first process. Because the heater connection pads 12 and the wiring 21 are heated in the second process, in this process, an electric connection through the wires 41 is performed at a temperature higher than the temperature in the first process. Further, because both the heater connection pads 12 and the wiring 21 are connected while being heated to the temperatures equal to or higher than 150° C., the electric connection portions can obtain the connection state capable of withstanding the external force that is assumed to be applied thereto when the product is in use (see FIG. 12B).

<Fourth Process>

The pads 11 and the wiring 21 are electrically connected to each other through the wire bonding while using the ultrasonic wave. The load applied to the pads 11 in the connection process is set to 50 g, while the other conditions for performing an electric connection and the material for the wire are the same as those described in the first process. The pads 11 and the wiring 21 are electrically connected through the first wires 41. Because the pads 11 and the wiring 21 are heated in the second process, in this process, the electric connection through the first wires 41 is performed at a temperature higher than the temperature in the first process. Further, because both the pads 11 and the wiring 21 are connected while being heated to the temperatures equal to or higher than 150° C., the electric connection portions can obtain the connection state capable of withstanding the external force that is assumed to be applied thereto when the product is in use (see FIG. 12C).

In addition, the third process and the fourth process can be performed in the reverse order.

Each of the heater connection pads 12 and the wiring 21 are connected through two wires. The first wire 41 having high connection strength, and the second wire 42 having low connection strength. The two wires will not short-circuited even if the two wires make contact with each other, and therefore, there is not any problem with leaving the two wires as those are.

Figure 13:
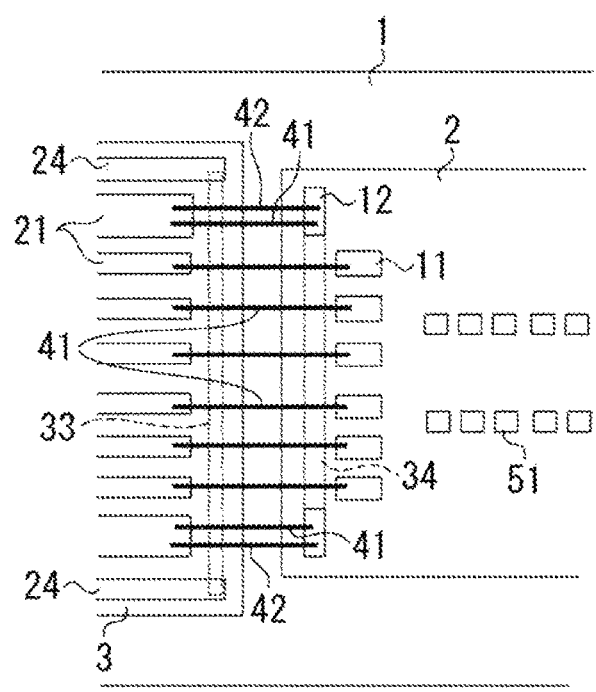
FIG. 13 is a schematic diagram illustrating an arrangement example of a dummy heater.

Furthermore, in the same manner as the second exemplary embodiment, a dummy heater 33 that is connected to electric wiring 24 may be disposed on the electric wiring substrate 3, so that difference in temperatures among the pads 11, the heater connection pads 12, and the wiring 21 can be reduced by supplying power to the dummy heater 33 while performing an electric connection (see FIG. 13). Further, in the same manner as the first and the second exemplary embodiments, arrangement of the heater 34 or the dummy heater 33 can be appropriately selected.

In the present exemplary embodiment, a mixture of spherical silica and PPS having high thermal resistance is used as a material for the supporting substrate 1. However, according to the present exemplary embodiment, a material having low thermal resistance can be used for the supporting substrate 1, or can be disposed between the semiconductor substrate 2 or the electric wiring substrate and the supporting substrate 1. For example, polyethylene terephthalate (PET) and denaturated polyphenylene ether (PPE) have high resistance to ink, so as to be commonly used as the constituent materials of the liquid discharge head. However, because of the low thermal resistance thereof, PET and PPE are assumed to be unsuitable to be used for the supporting substrate 1 or to be disposed in the vicinity of the supporting substrate 1 that is heated in the electric connection process. However, according to the present exemplary embodiment, because the electric connection portion can be heated to a desired temperature without interposing the supporting substrate 1, such materials having low thermal resistance can be used for the supporting substrate 1, or disposed in the vicinity of the supporting substrate 1.

In the present exemplary embodiment, the wire bonding has been described as an example of the electric connection method. However, the electric connection method to which the present invention is applicable is not limited thereto. The present invention is also applicable to the ILB in which the connection portion has to be heated when the electric connection process is performed thereon.

In the present exemplary embodiment, a liquid discharge head is described as an application example of the present invention. However, the application of the present invention is not limited thereto, and the present invention is also applicable to the electric connection process for an integrated circuit (IC) chip.

In the electric connection method according to the present invention, the connection portion is heated by the heater provided on the semiconductor substrate instead of being heated by the heater that makes contact with the back surface of the supporting substrate on which the semiconductor substrate and the electric wiring substrate are disposed. Because hot air does not have to pass through the space between the image recording apparatus and the recording point, positional adjustment using the image recording apparatus can be stably performed with high precision. Furthermore, because it is not necessary to perform the heating process on the electric connection portions one by one, the electric connection process can be performed within a short period of process time.

According to the present invention, it is possible to provide an electric connection method capable of electrically connecting a semiconductor substrate and an electric wiring substrate within a short period of process time by heating an electric connection portion without interposing a supporting substrate, while reducing a negative effect on a positional adjustment using an image recording apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-023351 filed Feb. 8, 2013, which is hereby incorporated by reference herein in its entirety.

What is claimed is:

1. An electric connection method for connection between a recording element substrate for discharging a liquid and an electric wiring substrate, the electric connection method comprising:

providing the recording element substrate having a discharge energy generation element for generating energy used to discharge a liquid, a heating member, and a first pad and a second pad, and providing the electric wiring substrate having a first wiring and a second wiring;

heating at least the second pad using heat generated by the heating member, the first pad, and the first wiring, wherein the first pad and the first wiring are electrically connected for electrically connecting the heating member and the first wiring; and electrically connecting the second pad and the second wiring.

2. The electric connection method according to claim 1, wherein the first pad and the first wiring are electrically connected for electrically connecting the heating member and the first wiring before heating at least the second pad.

3. The electric connection method according to claim 2, wherein a temperature of the recording element substrate for electrically connecting the first pad and the first wiring is lower than a temperature of the recording element substrate for electrically connecting the second pad and the second wiring.

4. The electric connection method according to claim 1, wherein the heating member does not contribute to discharge of a liquid caused by a driving force of the discharge energy generation element.

5. The electric connection method according to claim 1, wherein electric connection for the second pad and the second wiring is wire bonding.

6. The electric connection method according to claim 1, wherein electric connection unit for the first pad and the first wiring is wire bonding.

7. A liquid discharge head manufactured by the electric connection method according to claim 1.

8. The electric connection method according to claim 1, wherein while performing the heating at least the second pad, the second pad and the second wiring are electrically connected.

* * * * *